United States Patent
Stapleton

(10) Patent No.: US 6,977,546 B2
(45) Date of Patent: Dec. 20, 2005

(54) HIGH EFFICIENCY POWER AMPLIFIER SYSTEMS AND METHODS

(75) Inventor: Shawn Stapleton, Burnaby (CA)

(73) Assignee: Simon Fraser University, Burnaby (CA)

(*) Notice: Subject to any disclaimer, the term of this patent is extended or adjusted under 35 U.S.C. 154(b) by 0 days.

(21) Appl. No.: 10/003,725

(22) Filed: Oct. 30, 2001

(65) Prior Publication Data

US 2002/0097085 A1 Jul. 25, 2002

Related U.S. Application Data

(60) Provisional application No. 60/243,729, filed on Oct. 30, 2000.

(51) Int. Cl.[7] ............................................. H03F 3/38
(52) U.S. Cl. ...................................... 330/10; 330/251
(58) Field of Search ......................... 370/10, 59, 149, 370/207 A, 251, 129, 136; 375/297

(56) References Cited

U.S. PATENT DOCUMENTS

| | | | |
|---|---|---|---|
| 3,900,823 A | * 8/1975 | Sokal et al. ................ 330/149 |
| 4,843,339 A | 6/1989 | Burt et al. .................... 330/10 |
| 5,352,986 A | 10/1994 | Modgil et al. ................ 330/10 |
| 5,777,512 A | 7/1998 | Tripathi et al. ......... 330/207 A |
| 5,974,089 A | * 10/1999 | Tripathi et al. ............. 375/247 |
| 6,191,653 B1 | * 2/2001 | Camp, Jr. et al. ........... 330/129 |
| 6,373,334 B1 | * 4/2002 | Melanson ..................... 330/10 |
| 6,414,560 B2 | * 7/2002 | Delano ........................ 332/107 |
| 6,577,189 B2 | 6/2003 | Jayaraman et al. ......... 330/107 |
| 6,630,899 B2 | 10/2003 | Jayaraman ................... 341/200 |
| 6,794,930 B1 | * 9/2004 | Nurminen ..................... 330/10 |

OTHER PUBLICATIONS

Dallago, Single–Cycle Quasi–Resibabt Converters as Sigma–Delta Audio Power Stages, IEEE Jun. 1996, pp 645–650.

Anderson, A New Application for Zero–Current–Switched Full–Wave Resonant Converters, European Power Electronics Ass. 1993, pp 83–86.

Luckjiff, Dobson, Divan, Interpolative Sigma Delta Modulators for High Frequency Power Electronic Applications, IEEE Jun. 18, 1995, pp 444–449.

Ballan, Declercq, 12V $\Sigma$–$\Delta$ Amplifier in 5V CMOS Technology, IEEE 1995 Custom Integrated Circuits Conference, pp 26.5.1–26.54.

Opris & Kovacs, A Video bandwidth Analog Median Circuit, IEEE 1995 Custom Integrated Circuits Conference, pp 26.4.1–26.4.4.

* cited by examiner

Primary Examiner—Henry Choe
(74) Attorney, Agent, or Firm—Charles V. Bethards

(57) ABSTRACT

A high efficiency, low distortion switching mode power amplifier for telecommunication applications includes an analog to binary digital converter and a class S amplifier terminated by an output filter/matching network capable of operation over one or more frequency bands. The modulator may be connected to the class S amplifier with a fiber optic link. This construction can provide a low-distortion connection to remote antennas. Multiple modulators and amplifiers can be multiplexed over the fiber link to support a multiple sector antenna on a cell site or multiple transmitter elements on a phased array antenna.

45 Claims, 8 Drawing Sheets

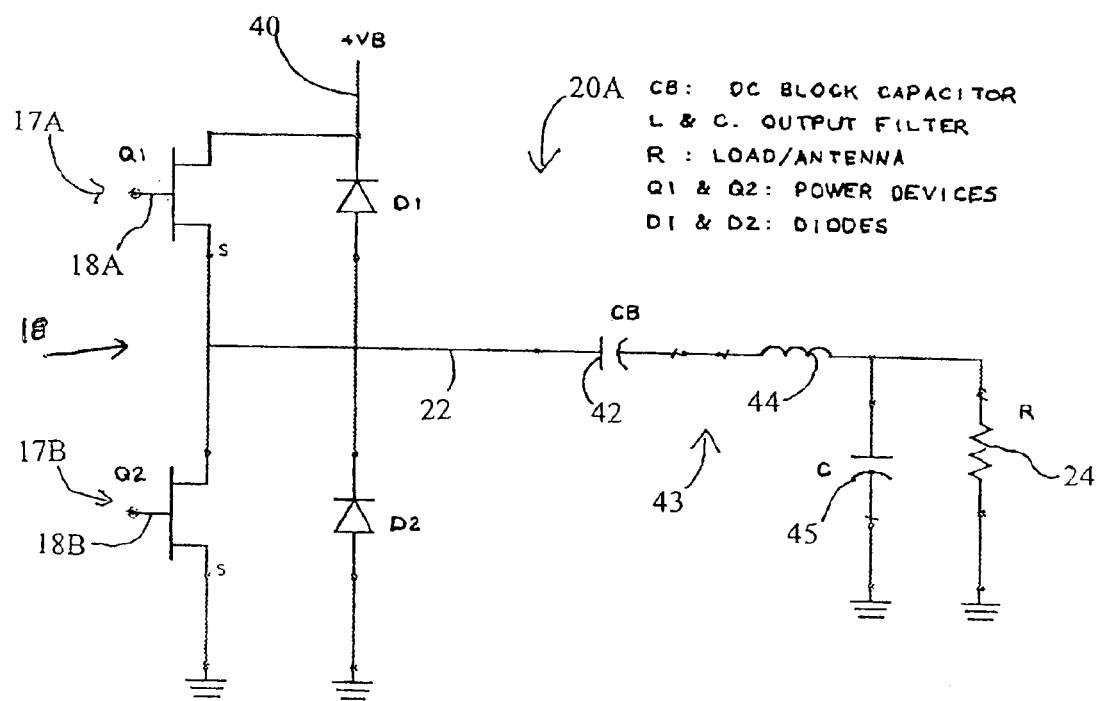
FIG. 2. CLASS S AMPLIFIER WITH 2 DEVICES.

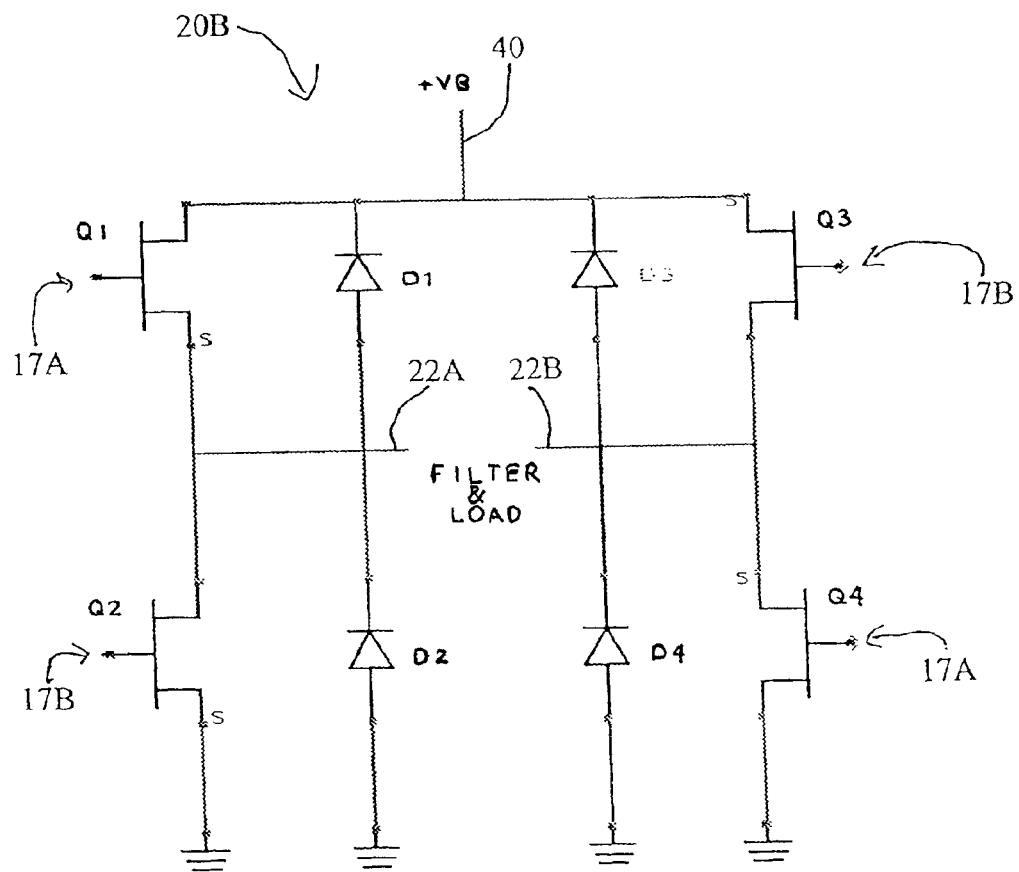
FIG. 3. CLASS S AMPLIFIER WITH 4 DEVICES. (H CONFIGURATION.)

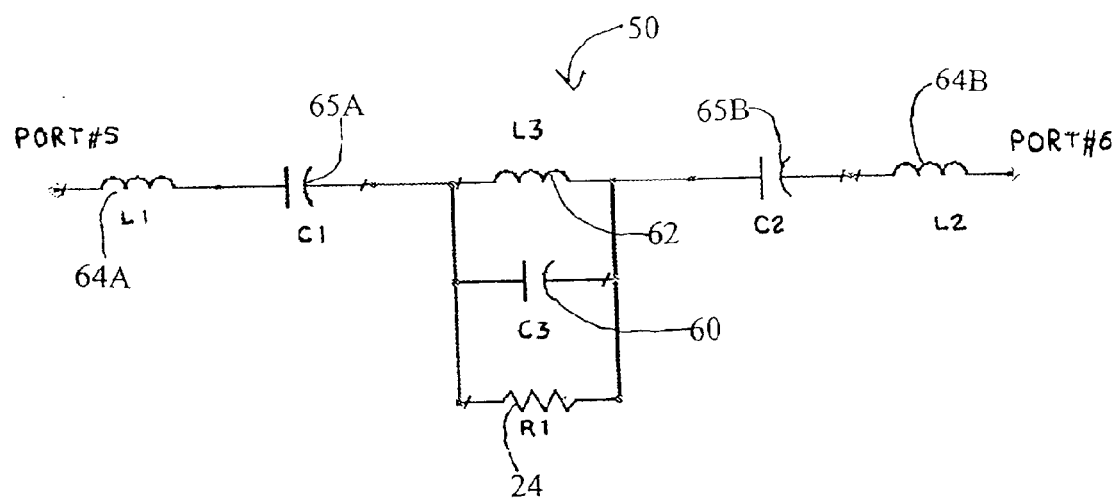
FIG. 4. CLASS S AMPLIFIER: OUTPUT FILTER AND LOAD SCHEMATIC

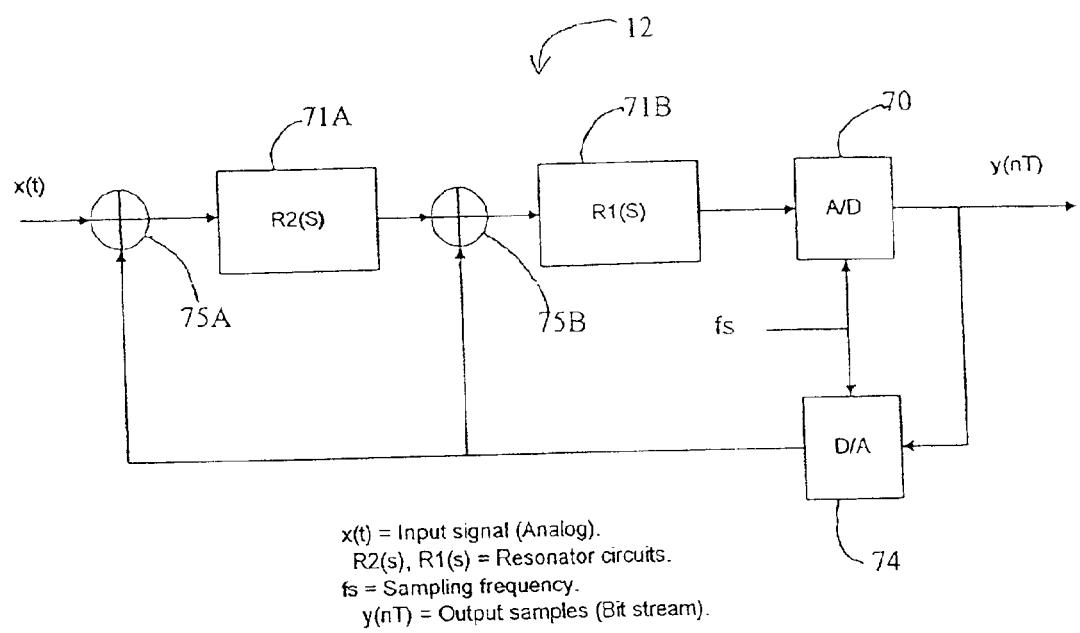
FIG. 5. CONTINUOUS TIME BANDPASS DELTA SIGMA MODULATOR USING DOUBLE FEEDBACK LOOP.

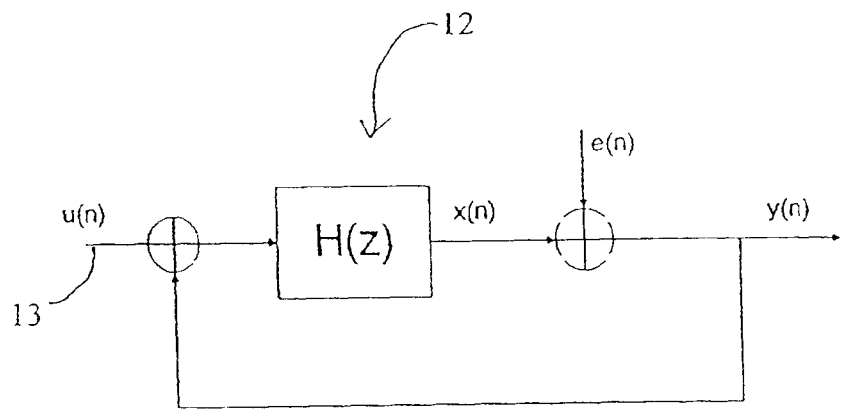
u(n)= Input signal
x(n)= Input to Quantizer
e(n)= Quantization noise as additive noise non-correlated with input
y(n)= Output bit stream
FIG. 6. SIMPLIFIED DISCRETE EQUIVALENT OF DELTA SIGMA MODULATOR

HIGH EFFICIENCY POWER AMPLIFIER SYSTEMS AND METHODS

CROSS REFERENCE TO RELATED APPLICATION

This application claims the benefit of U.S. provisional application Ser. No. 60/243,729 filed on 30 Oct. 2000 entitled "High Efficiency Multi-Carrier Microwave Power Amplifier Subsystem".

TECHNICAL FIELD

This invention relates to telecommunication and power amplification. The invention relates in particular to radio frequency power amplification and to power amplifier systems suitable for use in telecommunication applications such as cellular telephone repeaters. Embodiments of the invention provide amplification systems having bandwidth sufficient for multi-channel operation.

BACKGROUND

Power amplifiers of the type used in telecommunication applications are often inefficient. It is not unusual for such amplifiers to have energy efficiencies of well under 50%. This causes problems for the providers of telecommunication services because it is often desirable to provide power amplifiers in remote locations, such as hilltops. Delivering electrical power to such remote locations can be exceedingly expensive. Dealing with excess heat given off by inefficient power amplifiers can also be expensive and inconvenient.

Some designs of power amplifiers are known to be more efficient than others. However, not all types of amplifiers are well adapted to telecommunication or radar applications. Such applications typically require amplification systems which meet specifications relating to linearity, bandwidth and/or adaptability.

Switching mode power amplifiers (also known as class S amplifiers) are known to be capable of high efficiencies. The class S amplifier has an idealized efficiency of 100%. Class S amplifiers have mainly been used in lower frequency applications (typically up to a few kHz). To use a class S amplifier at higher frequencies requires switching devices capable of switching state very fast.

The prior art describes various power amplification systems, some of which promise increased efficiency. These include the systems described in U.S. Pat. Nos. 4,717,984; 5,159,287; and 5,905,407.

The characteristics of an amplification system depend not only upon the design of the amplifier itself but also depend upon the way in which the amplified signal is modulated. The so-called delta-sigma modulator has been studied extensively and has some desirable properties. Specific embodiments of the delta-sigma modulator are described, in U.S. Pat. Nos. 5,446,460 and; 5,714,916. Delta-sigma modulators are analysed and discussed in S. R. Norsworthy et al., *Delta Sigma data Converters: Theory Design and Simulation*, IEEE Press, New York, 1997; James Cherry and W. Martin Snelgrove, *Continuous Time Delta Sigma Modulators for High speed A/D Conversion*, Kluwer Academic Publishers, Boston, 2000; and Arun Jamayaraman et al., *Linear high-efficiency Microwave Power amplifiers using Band-pass Delta Sigma Modulators*, IEEE Microwave and Guided Letters Vol. 2 No. 3 March 1998, each of which is hereby incorporated by reference.

Despite the range of power amplification options provided by the prior art there remains a pressing need for power amplification systems which offer increased efficiency. There is a particular need for such systems which can be practically used for telecommunication applications, especially in remote locations

BRIEF DESCRIPTION OF THE DRAWINGS

In drawings which illustrate non-limiting embodiments of the invention:

FIG. 2 is a schematic diagram illustrating a class S amplifier having a totem pole configuration;

FIG. 3 is a schematic diagram illustrating a class S amplifier having an "H" configuration;

FIG. 4 is a schematic diagram illustrating a bandpass filter/matching network;

FIG. 5 is a block diagram of a bandpass delta-sigma modulator;

FIG. 6 is a model of the bandpass delta-sigma modulator of FIG. 5;

DETAILED DESCRIPTION

Throughout the following description, specific details are set forth in order to provide a more thorough understanding of the invention. However, the invention may be practised without these particulars. In other instances, well known elements have not been shown or described ill detail to avoid unnecessarily obscuring the invention Accordingly, the specification and drawings are to be regarded in an illustrative, rather than a restrictive, sense.

One aspect of this invention provides an amplification system which comprises the combination of an efficient power amplifier, a delta-sigma modulator and a linearizer circuit. While the invention is described herein primarily with reference to an embodiment useful for a microwave telecommunication repeater station the invention is not limited to this application. The amplification system may be used in base stations and in portable devices, such as cellular telephone handsets or other mobile radios. The amplification system may be applied in other contexts where amplification of signals is required. Preferred embodiments comprise an extended interface as described below. Some embodiments are powered by alternative power sources such as an array of solar cells, an electrical storage device, such as a storage battery powered by solar cells, wind power, or another source of energy which is available in the vicinity of the power amplifier.

Figure 1:
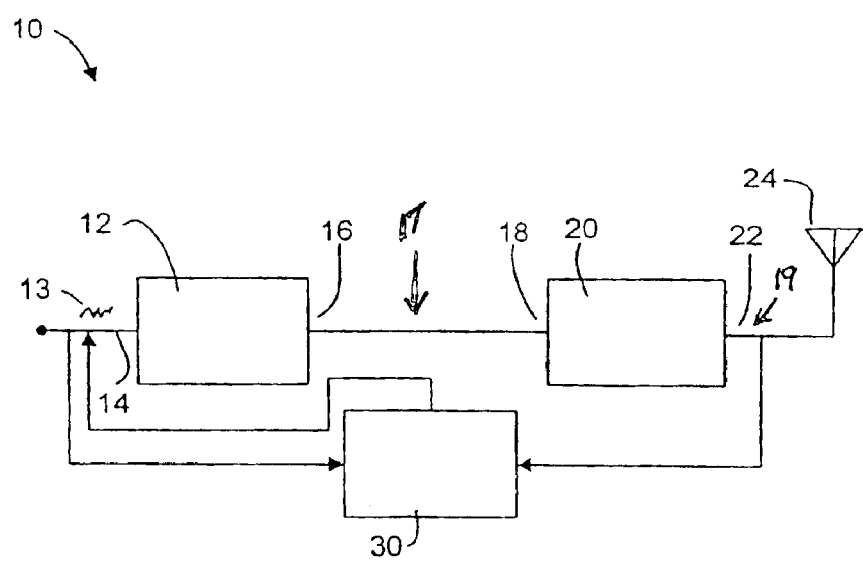
FIG. 1 is a block diagram of an amplification system.

FIG. 1 is a block diagram of an amplification system 10 according to the invention. Amplification system 10 comprises a modulator 12 which receives a signal 13 to be amplified at its input 14. Modulator 12 produces a digital output signal. Modulator 12 may be a delta sigma modulator. Modulator 12 has an output 16 coupled to an input 18 of a high efficiency amplifier 20. Amplifier 20 may be a class S amplifier. An output 22 of amplifier 20 is coupled to an antenna system 24. Preferred embodiments include a linearizer 30. Linearizer 30 is coupled to receive the signal 13 at input 14 and/or the signal 19 at output 22 and to develop a correction signal which is combined with the signal at a point before it is received at the input 18 of amplifier 20.

The overall characteristics of amplification system 10 are improved by linearizer 30. Linearizer 30 may implement any of a range of suitable linearization schemes. The functions of such linearization schemes include one or more of reducing distortion, reducing spectral re-growth, maintaining narrow frequency spacing between carriers and optimizing bandwidth. Linearizer 30 may provide linearization by one of or a combination of Feed Forward;

Analog Predistortion;

Digital Predistortion;

Adaptive Digital Predistortion;

Predistortion and Feed Forward; and,

Adaptive Feedforward.

Modulator 12 may comprise a delta-sigma modulator, which may be a band-pass delta-sigma modulator (BPDSM) of Nth order (typically $4^{th}$ order) with cascaded stages of 1 bit or multi-bit analog to digital converters (ADCs) and digital to analog converters (DACs). Modulator 12 converts the signal 13 to rectangular wave output signal 17. Signal 17 drives amplifier 20. Input RF signal 13 has a frequency in excess of about 300 kHz and may be a microwave frequency signal (i.e. signal 13 may have a frequency of about 800 MHz or more).

In some currently preferred embodiments of the invention, amplifier 20 comprises a switching mode power amplifier. For example, amplifier 20 may comprise a class S amplifier. Amplifier 20 could instead comprise a Class D switching-mode power amplifier. In other embodiments within the scope of the invention amplifier 20 may be of other types such as class C, E or F amplifier types. Especially for low power applications amplifier 20 may comprise an integrated circuit which carries electronic components which constitute amplifier 20. The integrated circuit may be fabricated using Miniature Microwave Integrated Circuit (MMIC) technology.

A switching mode power amplifier ("SMPA") includes active devices such as transistors or other electronic switches. Such amplifiers can be more efficient than an amplifier in which the active devices serve as current sources. An ideal switch has either zero voltage across its terminals or zero current through it at all times and therefore, no power is dissipated in the device. Where a transistor or other active device is used as a switch, the transistor or other active device may be configured so that it is working either in a pinch-off region or in saturation to approach the characteristics of an ideal switch.

In switching mode power amplifiers of class S or class D, amplification is achieved typically by two or more active devices. The devices typically comprise power transistors which may be connected in one of several configurations. FIGS. 2 and 3 illustrate simple class S amplifier configurations which are examples of configurations tat may be used in this invention. A great many other amplifier configurations are known to those, skilled in the art. The amplification circuits of FIGS. 2 and 3, together with all other suitable amplifier circuits known in the art have the function of amplifying an input signal and may be generally termed "means for amplifying".

FIG. 2 shows a simple class S amplifier 20A. Amplifier 20A has a pair of power transistors Q1 and Q2 arranged in a totem-pole configuration. Transistors Q1 and Q2 operate as switches controlled by signals 17A and 17B at inputs 18A and 18B, which together constitute an input 18 of amplifier 20A. Transistor Q2 is connected between output 22 and ground. Transistor Q1 is connected between an output 22 and a direct current power supply 40. Power supply 40 provides electrical power at a suitable voltage, which may be, for example, in the range of 6V to 60V.

The signals provided at inputs 18A and 18B cause transistors Q1 and Q2 to alternately connect output 22 to ground and to power supply 40. Transistors Q1 and Q2 are shunted by diodes D1 and D2. Diodes D1 and D2 protect transistors Q1 and Q2 respectively against damage due to switching transients. Transistors Q1 and Q2 may comprise field effect transistors or other signal controllable switching devices capable of operating as switches at the frequency of signals 17A and 17B. The signal controllable switching devices have the function of switching between electrically conducting and non-conducting states in response to a control signal (which may be electrical or optical). Such devices may be termed "means for switching".

Antenna 24 is connected to output 22 of amplifier 20A by a dc blocking device, such as a capacitor 42 and a filter 43. In the illustrated embodiment filter 43 comprises an inductor 44 coupled in series between dc blocking capacitor 42 and antenna 24 and a capacitor 45 connected across antenna 24.

A class S amplifier can be designed in a push-pull configuration with very wideband baluns providing a suitable phase inversion and impedance matching/conversion. All of the source terminals of switching devices in the amplifier may be grounded in this configuration.

FIG. 3 shows a class S amplifier 20B having switching devices arranged in an "H" configuration. The illustrated amplifier 20B comprises two pairs of power transistors (although other means for switching could also be used). Transistors Q1 and Q2 are connected in series with one another. Transistor Q1 is connected between an output 22A and a power supply 40. Transistor Q2 is connected between output 22A and ground. Transistors Q3 and Q4 are connected in series with one another. Transistor Q3 is connected between an output 22B and power supply 40. Transistor Q4 is connected between output 22B and ground.

Signal 17A is provided at the control inputs of transistors Q1 and Q4. Signal 17B is provided at the control inputs of transistors Q2 and Q3. Signal 17B may be an inverted version of signal 17A. Signals 17A and 17B are both bi-level rectangular signals.

When signal 17A has the proper polarity and amplitude, transistors Q1 and Q4 are conducting. This allows drain current (close to saturation) to flow at outputs 22A and 22B. While this occurs, signal 17B causes transistors Q2 and Q3 to be in an off state. The off state may be a pinch-off condition (i.e. no current flows through transistors Q2 and Q3 during this phase). When signals 17A and 17B reverse their levels, transistors Q1 and Q4 are switched to an off state (no drain current flowing) while transistors Q2 and Q3 are switched to an "on" state in which they permit current flow. Transistors Q2 and Q3 may be operating in saturation while in their on states.

One of diodes D1 through D4 are connected in parallel with each of transistors Q1 through Q4. Diodes D1 through D4 protect transistors Q1 through Q4 respectively against damage due to switching transients. Such transients may occur as a result of reverse current flow from spikes generated by charges accumulated in a capacitor in an output filter. A driven load, such as an antenna or an antenna together with any desirable filtering circuits may be coupled between outputs 22A and 22B.

Amplifier 20 may comprise a plurality of band-specific amplifier components operating in parallel. Each component may comprise one or more band-specific devices or circuits.

The output of amplifier 20 may be coupled to an antenna by way of an output bandpass filter/matching network arrangement. FIG. 4 shows an example of a possible bandpass filter/matching network 50. Bandpass filter 50 comprises a capacitor 60 and an inductor 62 coupled in parallel with an antenna 24. A series connected inductor, 64A, and capacitor 65A couple one antenna connection to the output of amplifier 20. A series connected inductor, 64B, and capacitor 65B couple the other antenna connection either to ground in the case of a single-sided amplifier as depicted, for example, in FIG. 2 or to another amplifier output, as m the case of a double-sided amplifier as depicted, for example, in FIG. 3.

Bandpass filter/matching network 50 may be coupled directly to the output of amplifier 20 (for example, to terminals 22A and, 22B) or coupled by way of a signal conditioning circuit, such as a filter or the like, a monitoring circuit etc. Bandpass filter matching network 50 may provide the functions of transforming amplified digital signals into analog signals, reducing the harmonics content present in the signal at the output of amplifier 20, and/or providing a proper impedance transition between amplifier 20 and a load (e.g. antenna 24 or another termination). These functions may be combined, as disclosed, or provided by separate elements or groups of elements. Those skilled in the art are aware of many specific suitable circuit constructions capable of providing these functions.

Network 50 may act as a tank circuit, converting the amplified rectangular shaped signals into an amplified version of the original analog signal 13.

The amplified signal at the output of amplifier 20 is ultimately manifested in antenna 24 as an analog signal containing the characteristics of the original input signal with an acceptably small level of spurious emissions, The amplified output signal is made available to an external load, such as an antenna, via suitable coaxial cables or waveguides.

FIGS. 5 and 6 show one example of a 4$^{th}$ order bandpass delta sigma modulator 12 that may be used in the context of the invention. Delta sigma modulator 12 comprises an analog to digital converter 70 which samples an analog input signal x(t) after it has passed through a pair of resonator circuits 71A and 71B. Analog to digital converter 70 samples input signal x(t) at a frequency which may be in excess of three times the frequency of input signal x(t) and could be, for example, 4 to 6 times greater than a frequency of input signal x(t). The output y(nT) of the analog to digital converter 70 provides an output signal for delta sigma modulator 12. Analog to digital converter 70 may comprise a sampler and a quantizer. The quantizer may comprise a two-level (single bit) trigger which assigns logical "TRUE" level to a positive input and a logical "FALSE" level to a negative input.

Output signal y(nT) is converted to an analog signal by a digital to analog converter 74. Digital to analog converter 74 may operate at the same frequency as analog to digital converter 70. Digital to analog converter 74 is located in a feedback loop of modulator 12. Digital to analog converter 74 converts the sequence of discrete pulses of output signal y(nT) back to analog.

Bandpass delta sigma modulator 12 may have a double loop configuration as shown in FIG. 4. The analog output from digital to analog converter 74 is combined (and is typically subtractively combined) with the input signal x(t) at points 75A and 75B. This configuration provides two overlapping feedback loops.

The quantization performed by analog to digital converter 70 can be modelled as shown in FIG. 6 as the addition of a noise signal e(n) to the input signal x(n) received by analog to digital converter 70. If the noise signal is independent enough from the input signal then it can be considered as an independent disturbance or additive noise. The final output waveform based on superposition of the input signal and the noise signal can be expressed as the sum of terms related to signal and noise respectively as follows, for example.

$$Y(z) = \frac{H(z)}{1+H(z)}X(z) + \frac{1}{1+H(z)}E(z) = STF(z) \times X(z) + NTF(z) \times E(z) \quad (1)$$

Where Y(z), X(z) and Z(z) are Z-transforms of u(n), y(n) and e(n) respectively.

In the preceding expression, STF(z) may be called a signal transfer function and NTF(z) may be called a noise transfer function. At the poles of H(z) and for many frequencies where H(z) is much greater than one, NTF(z) is small. At such frequencies the quantization noise is reduced. A function of modulator 12 is to convert an input analog signal into a signal of a type suitable for driving amplifier 20. Where amplifier 20 comprises a switching mode power amplifier then the output of modulator 12 may comprise a two-level signal of amplitude sufficient to drive amplifier 20 at frequencies of interest. For specific applications, one or more preamplifier or translation level stages may be provided to boost the amplitude of the modulated signal to a level suitable to drive amplifier 20.

The output signal y(nT) can be a pulse density modulated signal. As shown in FIG. 6, such an output from the delta-sigma modulator 12 is a binary digital signal that can be considered as the sum of an input signal and associated quantization noise. Modulator 12 is provided with digital filters to shape the output noise so that its spectrum has a valley corresponding to where the input spectrum falls in. Out-of-band noise can then be removed using properly designed bandpass filters to produce an approximate replica of the original signal.

An extended interface 80, such as an optical interface, may be provided to couple the output signal from delta sigma modulator 12 to the input of amplifier 20. Delta sigma modulator 12 and amplifier 20 may be in widely separated locations. For example, delta sigma modulator 12 may be located in a location where a mains power supply is available, while amplifier 20 may be located at a mountain top relay station. The extended interface may, for example, comprise an optical fiber date transmission line.

Figure 7A:
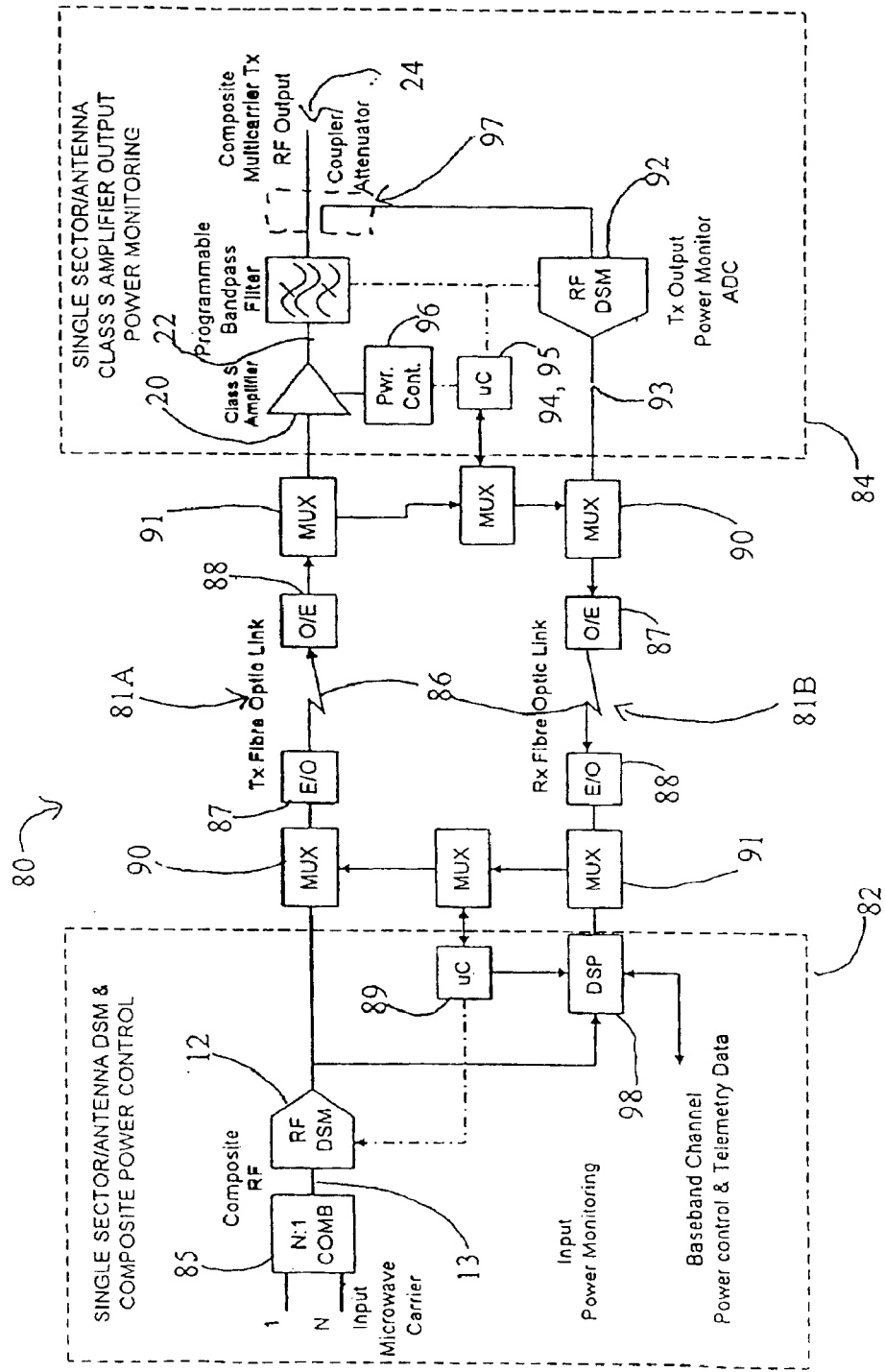
FIG. 7A is a block diagram of a microwave repeater system including an extended interface; and, FIG. 7B is a block diagram of a microwave repeater system including an extended interface and a plurality of amplifiers.

FIG. 7A illustrates an amplification system 79 which includes an extended interface 80. In the illustrated embodiment, interface 80 comprises a wideband two way interface. Interface 80 comprises a forward direction extended link 81A which carries data from a control location 82 to a transmitting location 84 and a reverse direction link 81B which caries data in the opposite direction. Each of links 81A and 81B may comprise a fiber optic signal conductor 86, an electrical to optical transducer 87 and an optical to electrical transducer 88. A single optical fibre may be used to combine both forward and reverse direction links 81A and 81B by using optical wavelength division multiplexing. This may be implemented, for example, by providing electro-optical converters with different optical wavelengths in each direction along with appropriate optical filters. The filters could be, for example, 1.3 $\mu$m and 1.5 $\mu$m.

Extended interface 80 could comprise one or more low-loss RF coaxial cables, or other RF waveguides in place of a fiber optic cable. In some cases, multiple channels may be cried on a single waveguide through the use of a suitable number of frequency diplexers. The diplexers direct the selected receiver or transmitter signals according to their center frequencies and bandwidths. Extended interface 80 could comprise signal carriers of a cable TV distribution system or a microwave radio relay system. The optical fiber, coaxial cable, other waveguide, or radio relay system, provides the function of carrying signals between control location 82 and transmitter location 84.

A modulator 12 which produces a digital output signal is located at control location 82. The digital output signal is carried to transmitting location 84 on forward direction link 81A. The digital output signal is received at transmitting location 84 and applied as an input to amplifier 20. Amplifier 20 amplifies the digital signal and produces an amplified output signal. The amplified output signal is coupled to an input of a bandpass filter which may be a programmable bandpass filter. A signal output from the bandpass filter is coupled to a load such as an antenna. Extended interface 80 may be long, for example from the bottom to the top of a mountain, or short. A long extended interface 80 may span more than more than 100 meters, more than 500 meters or more than 1000 meters.

Amplifier 20 may be located very close to antenna 24. For example, where antenna 24 is on a tower, amplifier 20 may also be on the tower at the location of antenna 24, possibly immediately behind antenna 24 or proximate to the connections to antenna 24. Modulator 12 may be located in another location such as at a control location at the bottom of the tower or a control location completely away from the tower. In this disclosure the term "tower" means a structure providing an elevated location for mounting an antenna and includes purpose built tower structures, other man-made structures, and suitable natural features either in their natural states or modified by man.

The signal to be transmitted at transmitting location 84 may be an amplified version of a signal received at a receiver located at or in the vicinity of transmitting location 84 In this case, input signal 13 may be carried to control location 82 by way of reverse direction link 81B. Input signal 13 may be digitized by an analog-to-digital converter for transmission on reverse direction link 81B. Input signal 13 may be multiplexed with other data such as amplifier power monitoring data and other telemetry signals. Where multiple channels are to be included ill a single input signal 13, an N:1 combiner 85 may combine the channel signals to provide signal 13 which is modulated by modulator 12.

The signal maybe processed in various ways at control location 82 and then Feed back to transmitting location 84 by way of forward direction link 81A to transmitting location 84 for amplification and transmission. The processing may include digital filtering.

Reverse direction link 81B may carry feedback signals to control location 82. The feedback signals are received at location 82 where they can be used as an input to a linearizer 30 (not shown in FIG. 7A). A linearizer maybe implemented in DSP 98, processor 89, or as a separate system.

One or more telemetry channels may be provided by extended interface 80. In the illustrated embodiment, this is done by providing a multiplexer 90 and a demultiplexer 91 at first and second ends respectively of links 81A and 81B. Telemetry channels of links 81A and 81B may carry power monitoring signals, control signals, signals regarding the operational status of subsystems at transmitting location 84, alarm signals and the like.

In the illustrated embodiment, the power output of amplifier 20 is monitored in real time by a power monitor 92. Power monitor 92 may comprise an RF power detector such as an RF Root Mean Square (RF RMS) composite power monitor circuit which generates an output signal 93. Output signal 93 is carried to control location 82 by a telemetry channel on receive direction link 81B. Power monitor 92 is coupled to the input and/or output of power amplifier 20 by way of suitable directional couplers and/or attenuators. Power monitor 92 monitors the voltage at the output 22 of power amplifier 20 for the required frequency and level ranges. This may be done with a suitable analog to digital converter. RMS power may be determined by a microcontroller 95 which receives information regarding voltages sampled by the analog to digital converter. Power monitor 92 can be calibrated against frequency, and level references and temperature compensated in ways known to those skilled in the art of RF power monitoring circuits.

In the illustrated embodiment, power monitor output signal 93 is provided to linearizer 30. Lines 30 may generate its corrective signal based, at least in part, on signal 93. For example, linearizer 30 may perform predistortion or other linearization enhancements based on signal 93.

The power output of amplifier 20 may be dynamically controlled to provide adequate power in regard to current propagation and traffic loading conditions. For example, when channels of a multichannel carrier are unoccupied, transmitter power may be reduced. As the signal attenuation changes on a propagation path between antenna 24 and a receiver, the power can be adjusted to maintain a desired signal to noise performance. The receiver may be moving relative to antenna 24. When the receiver is near antenna 24 in a line of sight then the power of amplifier 20 may be reduced. When the receiver is farther from antenna 24 or not in a clear line of sight then the power output of amplifier 20 may need to be increased.

The power output of amplifier 20 may be adjusted in response to factors which may include one or more of channel count (the number of active and/or overhead channels), channel link loss parameters, parameters specified by an air link protocol, such as IS95A,B or the like. The parameters which affect the desirable power output may be maintained as data accessible to microcontroller 95. Microcontroller 95 sets the output power by way of a power control interface 96.

To permit the output power to be controlled on demand, amplifier may be configured to permit:
Actively biasing the power devices by adjusting the drain current and/or voltage, according to demand, and/or
Enabling or disabling devices in a multiple device power-combining design.

A multiple device power combining design may comprise, for example, multiple paralleled H configurations. A number of class S amplifiers in parallel may be provided and electronically selected to increase or decrease the radiated power on a specific antenna.

Spectrum performance may be monitored by a monitoring system 94. Spectrum monitoring system 94 may comprise a separate system or may comprise suitable software running on a processor 95 which receives a signal modulated by a microwave delta sigma modulator (which may also serve as a part of power monitoring system 92). An output signal from spectrum monitoring system 94 may be carried back to control location 82 on receive direction link 81B. A decimating filter maybe provided to down-convert the microwave signal to baseband for digital signal processing. A digital signal processor 98 analyzes the signal output by amplifier 20. Processor 96 may monitor for in-band and out-of-band spurious emissions, including intermodulation products.

Short, open or impairment conditions on a transmission line or antenna 24 connected to the output of amplifier 20 may be detected with a line integrity monitor (LIM). The LIM comprises an RF power and spectrum monitoring system 94 and associated processor 95. The LIM is switched between the forward and reverse port of a bi-directional coupler 97 for measurements. The LIM periodically determines a return loss versus distance profile and monitors antenna intermodulation performance based on detected forward and reverse signals. Alarms are generated and transmitted to control location 82 when the return loss versus distance profile and/or antenna intermodulation performance satisfy an alarm criterion. The alarm criterion may comprise a comparison of one or more of these values to one or more preset thresholds.

Figure 7B:
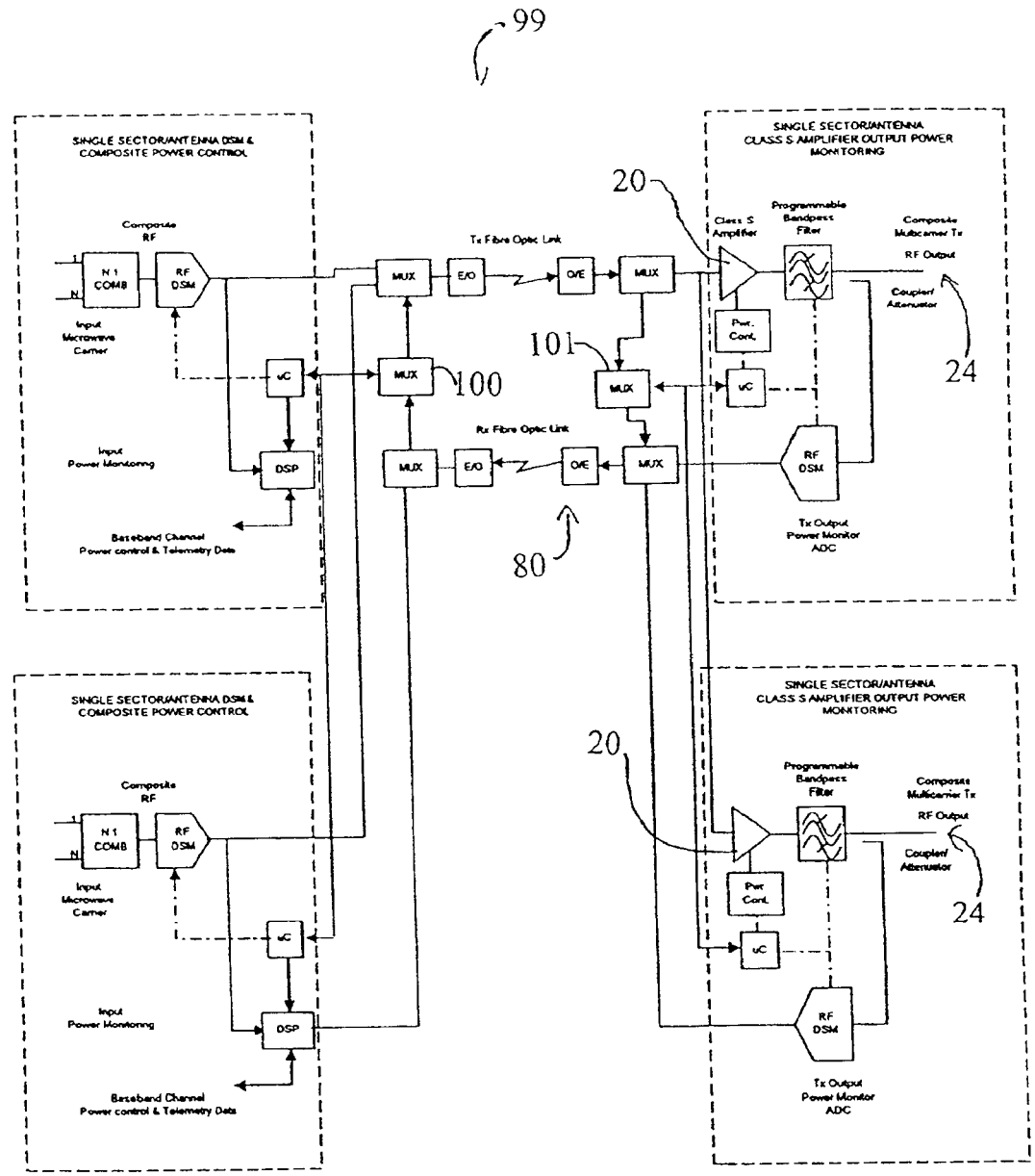

FIG. 7B illustrates a transmitting system 99 which includes multiple amplifiers 20 each of which drives a separate antenna 24. The antennas 24 may comprise independent antennas or sections in a multisector antenna. System 99 provides multiple channels. Each channel provides a signal feed to an antenna 24. System 99 typically provides one antenna 24 per sector of a multi-sector antenna The multi-sector antenna may, for example, have 6 sectors. The multi-sector antenna may be on a tower with amplifiers 20 installed on the tower to operate simultaneously with several fixed sector antennas.

Antennas 24 maybe arranged to provide a phased array. The array may comprise a number N of elements having a first orientation, for example vertical, and a number M of elements having a second orientation, for example horizontal. Such an array may require N×M channels with one channel providing a suitably phased signal a corresponding element of the array. The amplifiers 20 driving the array elements may be electronically controlled to no provide beam steering. The system may comprise one or more arrayed antennas and/or multi-sectored antennas on the same tower with a plurality of amplifiers receiving modulation signals over the same extended interface from modulators located at another (second) end of the extended interface.

A four port directional coupler may be provided at the output of amplifier 20 with power and spectrum monitoring capabilities. This permits measurements on forward and reverse directions of the antenna transmission line to derive Return Loss (RL) and distance to fault values. Alarm thresholds may be set for these parameters and exceptions reported over the telemetry link.

In the embodiment of FIG. 7B, extended interface 80 comprises a single fiber optic link wherein signals for the different channels are multiplexed together For example, the signals may be combined using time-domain multiplexing, optical wavelength division multiplexing, or a combination of the two. Suitable multiplexer/demultiplexers are provided at each end of extended interface 80. The illustrated embodiment provides a very high speed multi-port time domain multiplexer 100 operating at several gigabits per second and a compatible demultiplexer 101. Other embodiments use multiple links each comprising a fiber optic cable or other suitable transmission medium.

Systems according to the invention may operate at power sufficient for operation as, for example, in cellular repeater stations. Other embodiments may operate at lower powers, for example in cellular hand sets The systems may operate in any of various bands including VHF, UHF, SHF, EHF (L, S, X, Ku, Ka, etc.). The system may operate with multiple narrow and wideband signals with different types of phase, frequency, amplitude and code domain modulations such as CDMA, W-CDMA, TDMA, FM, QPSK, multilevel QAM, QAM and so on.

Some embodiments of the invention comprise a multi-band bandpass delta sigma modulator and a tunable output filter connected between amplifier 20 and antenna 24. Such embodiments may comprise a control system connected to switch the operation of the system between two or more different frequency bands. Such embodiments may be used, for example, in cellular telephone handsets. The frequency band may be automatically selected to access cellular connections on cellular and or selectable networks using more than one frequency band.

Embodiments of the invention may support sampling of baseband transmit signals and direct up conversion to RF/microwave signals.

Some embodiments of the invention comprise bandpass delta sigma modulators which have multiple decimation filters and are over sampled at high frequencies. Such embodiments may be capable of simultaneous multiple band operation. Such embodiments may be provided in base stations or handsets.

Where a component (e.g. an assembly, device, memory, etc.) is referred to herein, unless otherwise indicated, reference to that component (including a reference to a "means") should be interpreted as a reference to any component which performs the function of the described component (i.e. is functionally equivalent to the described component), including components which are not structurally equivalent to the disclosed structure which performs the function in the illustrated exemplary embodiments of the invention. Where a step in a method is referred to above, unless otherwise indicated, reference to that step should be interpreted as a reference to any step which achieves the same result as the step (i.e. is functionally equivalent to the described step), including steps which achieve a stated result in different ways from those disclosed in the illustrated exemplary embodiments of the invention.

As will be apparent to those skilled in the art in the light of the foregoing disclosure, many alterations and modifications are possible in the practice of this invention without departing from the spirit or scope thereof. For example:

certain aspects of the invention could be implemented in software or hardware or a combination of software and hardware;

the various functional components illustrated in the drawings may be combined with one another in different ways.

Accordingly, the scope of the invention is to be construed in accordance with the substance defined by the following claims.

What is claimed is:

1. A radio frequency amplifier system comprising:
   a delta sigma modulator connected to receive an input signal and produce a bi-level modulation signal;
   a switching mode power amplifier driven by the bi-level modulation signal and operable to provide a radio frequency signal at an output; and
   a linearizer, coupled to the input signal and the radio frequency signal, operable to supply a corrective signal at a location prior to the switching mode power amplifier, the linearizer using an adaptive process.

2. The radio frequency amplifier system of claim 1 wherein the delta sigma modulator comprises a bandpass delta sigma modulator.

3. The radio frequency amplifier system of claim 2 wherein the bandpass delta sigma modulator comprises a multi-band bandpass delta sigma modulator.

4. The radio frequency amplifier system of claim 1 comprising a tunable output filter coupled to the output of the amplifier, the tunable output filter tunable to a plurality of frequency bands.

5. The radio frequency power amplifier system of claim 1 wherein the delta sigma modulator comprises:
- a digital-to-analog converter coupled to receive a signal from an output of a first resonator circuit and present the digitized signal at an output of the delta sigma modulator,
- a second resonator circuit having an input coupled to receive an input signal and an output coupled to an input of the first resonator circuit, and
- an analog-to-digital converter coupled to receive the digitized signal, generate a recreated analog signal from the digitized signal, and combine the recreated analog signal with signals at the inputs of each of the first and second resonator circuits.

6. The radio frequency amplifier system of claim 1 wherein the switching mode power amplifier comprises a class S amplifier.

7. The radio frequency amplifier system of claim 1 wherein the switching mode power amplifier comprises a class D amplifier.

8. The radio frequency amplifier system of claim 1 comprising an extended interface between the delta sigma modulator and the switching mode power amplifier, the extended interface carrying the bi-level modulation signal.

9. The radio frequency amplifier system of claim 8 wherein the extended interface comprises a first coupling circuit coupling the bi-level modulation signal to a transmission medium and a second coupling circuit coupling the bi-level modulation signal to the switching mode power amplifier.

10. The radio frequency amplifier system of claim 9 wherein the transmission medium comprises an optical transmission medium, the first coupling circuit comprises an electro-optical coupler and the second coupling circuit comprises an opto-electrical coupler.

11. The radio frequency amplifier system of claim 10 wherein the optical transmission medium comprises an optical fiber.

12. The radio frequency amplifier system of claim 9 wherein the transmission medium comprises a microwave radio link, the first coupling circuit comprises a high speed digital modulator and the second coupling circuit comprises a high speed digital demodulator.

13. The radio frequency amplifier system of claim 9 wherein the transmission medium comprises a path through signal carriers of a cable television system, the first coupling circuit comprises a high speed digital modulator and the second coupling circuit comprises a high speed digital demodulator.

14. The radio frequency amplifier system of claim 9 wherein the transmission medium comprises a coaxial cable.

15. The radio frequency amplifier system of claim 9 wherein the extended interface is bidirectional.

16. The radio frequency power amplifier system of claim 9 wherein the first and second coupling circuits are separated by a distance of at least 10 meters.

17. The radio frequency amplifier system of claim 9 wherein the first and second coupling circuits are separated by a distance of at least 500 meters.

18. The radio frequency amplifier system of claim 9 wherein the linearizer generates the corrective signal at least in part from a feedback signal from an output of the switching mode power amplifier and the feedback signal is carried on the extended interface.

19. The radio frequency amplifier system of claim 18 comprises a power monitor coupled to the output of the switching mode power amplifier wherein the feedback signal comprises a signal carrying information regarding a power level detected by the power monitor.

20. The radio frequency amplifier system of claim 1 wherein the linearizer is configured to generate a predistortion signal based upon a feedback signal from an output of the switching mode power amplifier and the corrective signal is based upon the predistortion signal.

21. The radio frequency power amplifier system of claim 1 wherein the linearizer is configured to generate the corrective signal through one or more of: feed forward; analog predistortion; digital predistortion; adaptive digital predistortion; predistortion and feed forward; and adaptive feedforward.

22. The radio frequency power amplifier system of claim 1 having a passband at a frequency in excess of 300 kHz.

23. The radio frequency power amplifier system of claim 1 having a passband at a frequency in excess of 800 MHz.

24. The radio frequency power amplifier system of claim 1 wherein the output of the switching mode power amplifier is coupled to an antenna, the switching mode power amplifier is located within 2 meters from the antenna and the delta sigma modulator is located more than 5 meters from the antenna.

25. The radio frequency power amplifier system of claim 1 comprising a harmonic filter connected at the output of the switching mode power amplifier.

26. The radio frequency power amplifier system of claim 6 wherein the class S amplifier comprises two electronic switching device in a totem pole configuration.

27. The radio frequency power amplifier system of claim 6 wherein the output of the class S amplifier comprises first and second terminals and the class S amplifier comprises first and second switching devices connected in series with one another, the first switching device coupled between the first terminal and a first conductor, the second switching device coupled between the first terminal and a second conductor maintained at a second voltage relative to the first conductor by a power supply, and second and third switching devices connected in series with one another, the second switching device coupled between the first conductor and the second terminal, the fourth switching device coupled between the second terminal and the second conductor.

28. The radio frequency power amplifier system of claim 1 wherein the switching mode power amplifier has an adjustable output power.

29. The radio frequency power amplifier system of claim 28 wherein the switching mode power amplifier comprises an electronically variable voltage bias power supply and a mechanism connected to vary the voltage of the bias power supply and thereby vary the output power of the switching mode power amplifier.

30. The radio frequency power amplifier system of claim 28 wherein the switching mode power amplifier comprises a plurality of parallel-connected amplification circuits and a mechanism connected to adjust the output power by varying a number of the amplification circuits which are active by selectively enabling or disabling some of the amplification circuits.

31. The radio frequency power amplifier system of claim 30 wherein each of the amplification circuits comprises an electronically variable voltage bias power supply and a mechanism connected to vary the voltage of the bias power supply and the amplification circuits are enabled and disabled by varying the voltage of the corresponding bias power supply.

32. The radio frequency power amplifier system of claim 21 comprising a mechanism for adjusting the output power of the switching mode power amplifier in response to a channel count, a channel link loss parameter, or both a channel count and a channel link loss parameter.

33. The radio frequency power amplifier system of claim 1 wherein the delta sigma modulator comprises a multiband bandpass delta sigma modulator capable operating in two or more frequency bands simultaneously.

34. The radio frequency power amplifier system of claim 33 comprising a multiband programmable variable tuning output filter connected to filter a signal amplified by the switching mode power amplifier.

35. The radio frequency power amplifier system of claim 8 wherein the switching mode power amplifier is coupled to an antenna, the antenna and switching mode power amplifier are both on a tower and the delta sigma modulator is not located on the tower.

36. The radio frequency power amplifier system of claim 1 comprising a power supply connected to supply electrical power to the switching mode power amplifier wherein the power supply comprises a solar panel.

37. The radio frequency power amplifier system of claim 1 comprising a power supply connected to supply electrical power to the switching mode power amplifier wherein the power supply comprises a wind generator.

38. The radio frequency power amplifier system of claim 37 wherein the power supply comprises an electrical storage cell charged by the wind generator and a dc-dc step-up converter connected to receive power from the storage cell at a voltage of the storage cell and provide the power to the switching mode power amplifier at an increased voltage greater than the voltage of the storage cell.

39. A radio frequency amplifier system comprising:
a bandpass delta sigma modulator connected to receive an input signal and produce a bi-level modulation signal;
a switching mode power amplifier driven by the bi-level modulation signal and having an output, the switching mode power amplifier operable to provide a radio frequency signal; and
a linearizer, coupled to the input signal, the radio frequency signal and the output of the switching mode power amplifier, operable to supply a corrective signal at a location prior to the switching mode power amplifier, the linearizer using an adaptive linearization process.

40. The radio frequency amplifier system of claim 39 wherein the bandpass delta sigma modulator comprises a multi-band bandpass delta sigma modulator.

41. The radio frequency power amplifier system of claim 39 wherein the switching mode power amplifier has an adjustable output power.

42. The radio frequency power amplifier system of claim 39 wherein the switching mode power amplifier comprises an electronically variable voltage bias power supply and a mechanism connected to vary the voltage of the bias power supply and thereby vary the output power of the switching mode power amplifier.

43. The radio frequency power amplifier system of claim 41 wherein the switching mode power amplifier comprises a plurality of parallel-connected amplification circuits and a mechanism connected to adjust the output power by varying a number of the amplification circuits which are active by selectively enabling or disabling some of the amplification circuits.

44. The radio frequency amplifier system of claim 39 wherein the linearizer is configured to generate a predistortion signal based upon a feedback signal and the corrective signal is based upon the predistortion signal.

45. The radio frequency power amplifier system of claim 39 wherein the linearizer is configured to generate the corrective signal through one or more of: feed forward; analog predistortion; digital predistortion; adaptive digital predistortion; predistortion and feed forward; and adaptive feedforward processes.

* * * * *

UNITED STATES PATENT AND TRADEMARK OFFICE
CERTIFICATE OF CORRECTION

PATENT NO. : 6,977,546 B2  Page 1 of 1
DATED : December 20, 2005
INVENTOR(S) : Stapleton It is certified that error appears in the above-identified patent and that said Letters Patent is hereby corrected as shown below:

<u>Column 14,</u>
Line 15, delete "39" and insert -- 41 --.

Signed and Sealed this

Fourth Day of April, 2006

JON W. DUDAS
*Director of the United States Patent and Trademark Office*